US008803663B2

(12) United States Patent
Ishii et al.

(10) Patent No.: US 8,803,663 B2
(45) Date of Patent: Aug. 12, 2014

(54) SEMICONDUCTOR DEVICE, ELECTRONIC APPLIANCE USING SEMICONDUCTOR DEVICE, AND DOCUMENT USING SEMICONDUCTOR DEVICE

(75) Inventors: Masato Ishii, Kanagawa (JP); Tomoaki Atsumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1238 days.

(21) Appl. No.: 12/645,082

(22) Filed: Dec. 22, 2009

(65) Prior Publication Data
US 2010/0163631 A1 Jul. 1, 2010

(30) Foreign Application Priority Data

Dec. 25, 2008 (JP) ................................ 2008-329711

(51) Int. Cl.
*G06F 13/00* (2006.01)
*G06F 5/06* (2006.01)

(52) U.S. Cl.
USPC .................. 340/10.33; 340/10.51; 340/10.52

(58) Field of Classification Search
USPC ................................ 340/10.33, 10.51, 10.52
See application file for complete search history.

(56) References Cited

U.S. PATENT DOCUMENTS

| 4,947,407 | A | | 8/1990 | Silvian |
|---|---|---|---|---|
| 5,289,580 | A | * | 2/1994 | Latif et al. ...................... 710/63 |
| 7,494,066 | B2 | | 2/2009 | Koyama et al. |
| 7,612,598 | B2 | | 11/2009 | Endo |
| 8,049,573 | B2 | * | 11/2011 | Alfano et al. ...................... 333/1 |
| 2005/0075079 | A1 | * | 4/2005 | Jei et al. ........................... 455/73 |
| 2006/0277426 | A1 | * | 12/2006 | Lindorfer et al. .............. 713/400 |
| 2007/0230648 | A1 | * | 10/2007 | Gupta et al. .................... 375/371 |
| 2007/0290207 | A1 | | 12/2007 | Atsumi et al. |
| 2008/0025450 | A1 | * | 1/2008 | Alfano et al. .................. 375/362 |

(Continued)

FOREIGN PATENT DOCUMENTS

| EP | 0 412 427 A2 | 2/1991 |
|---|---|---|
| JP | 64-26432 | 1/1989 |

(Continued)

OTHER PUBLICATIONS

Kurokawa, Yoshiyuki et al., UHF RFCPUs on Flexible and Glass Substrates for Secure RFID Systems, Jan. 2008, IEEE Journal of Solid-State Circuits, vol. 43, No. 1, all pages pertinent.*

(Continued)

*Primary Examiner* — Daniel Wu
*Assistant Examiner* — John Bamert
(74) *Attorney, Agent, or Firm* — Husch Blackwell LLP

(57) ABSTRACT

A semiconductor device capable of wireless communication which has low power consumption in a step for decoding an encoded signal to obtain data is provided. The semiconductor device includes an antenna configured to convert received carrier waves into an AC signal, a rectifier circuit configured to rectify the AC signal into a DC voltage, a demodulation circuit configured to demodulate the AC signal into an encoded signal, an oscillator circuit configured to generate a clock signal having a certain frequency by supply of the DC voltage, a synchronizing circuit configured to generate a synchronized encoded signal by synchronizing the encoded signal obtained by demodulating the AC signal with the clock signal, a decoder circuit configured to decode the synchronized encoded signal into a decoded signal, and a register configured to store the decoded signal as a clock (referred to as a digital signal).

26 Claims, 15 Drawing Sheets

(56) References Cited

U.S. PATENT DOCUMENTS

| | | | |
|---|---|---|---|
| 2008/0040562 A1* | 2/2008 | Gower et al. | 711/154 |
| 2008/0088367 A1 | 4/2008 | Atsumi | |
| 2009/0129593 A1* | 5/2009 | Ishii | 380/59 |
| 2010/0005218 A1* | 1/2010 | Gower et al. | 711/5 |

FOREIGN PATENT DOCUMENTS

| | | |
|---|---|---|
| JP | 3-76346 | 4/1991 |
| JP | 10-107859 | 4/1998 |
| JP | 2003-244014 | 8/2003 |
| JP | 2006-109276 | 4/2006 |
| JP | 2008-10849 | 1/2008 |
| WO | WO 2006/038710 A1 | 4/2006 |

OTHER PUBLICATIONS

Kurokawa, Y. et al., "UHF RFCPUs on Flexible and Glass Substrates for Secure RFID Systems," ISSCC 2007 (Digest of Technical Papers, IEEE International Solid-State Circuits Conference), Feb. 14, 2007, pp. 574-575.

Kurokawa, Y. et al., "UHF RFCPUs on Flexible and Glass Substrates for Secure RFID Systems," IEEE Journal of Solid-State Circuits, vol. 43, No. 1, Jan. 2008, pp. 292-299.

International Search Report re application No. PCT/JP2009/071197, dated Feb. 16, 2010.

Written Opinion re application No. PCT/JP2009/071197, dated Feb. 16, 2010.

Man, Adam, S.W. et al, "Design and Implementation of a Low-Power Baseband-System for RFID Tag," ISCAS 2007, IEEE International Symposium on Circuits and Systems, 2007, pp. 1585-1588.

Kim, S.-J. et al., "An Ultra Low Power UHF RFID Tag Front-End for EPCglobal Gen2 with Novel Clock-Free Decoder," IEEE International Symposium on Circuits and Systems, May 18, 2008, pp. 660-663.

Hong, Y. et al., "Design and Challenges of Passive UHF RFID Tag in 90nm CMOS Technology," IEEE International Conference on Electron Devices and Solid-State Circuits, Dec. 8, 2008, pp. 1-4.

* cited by examiner

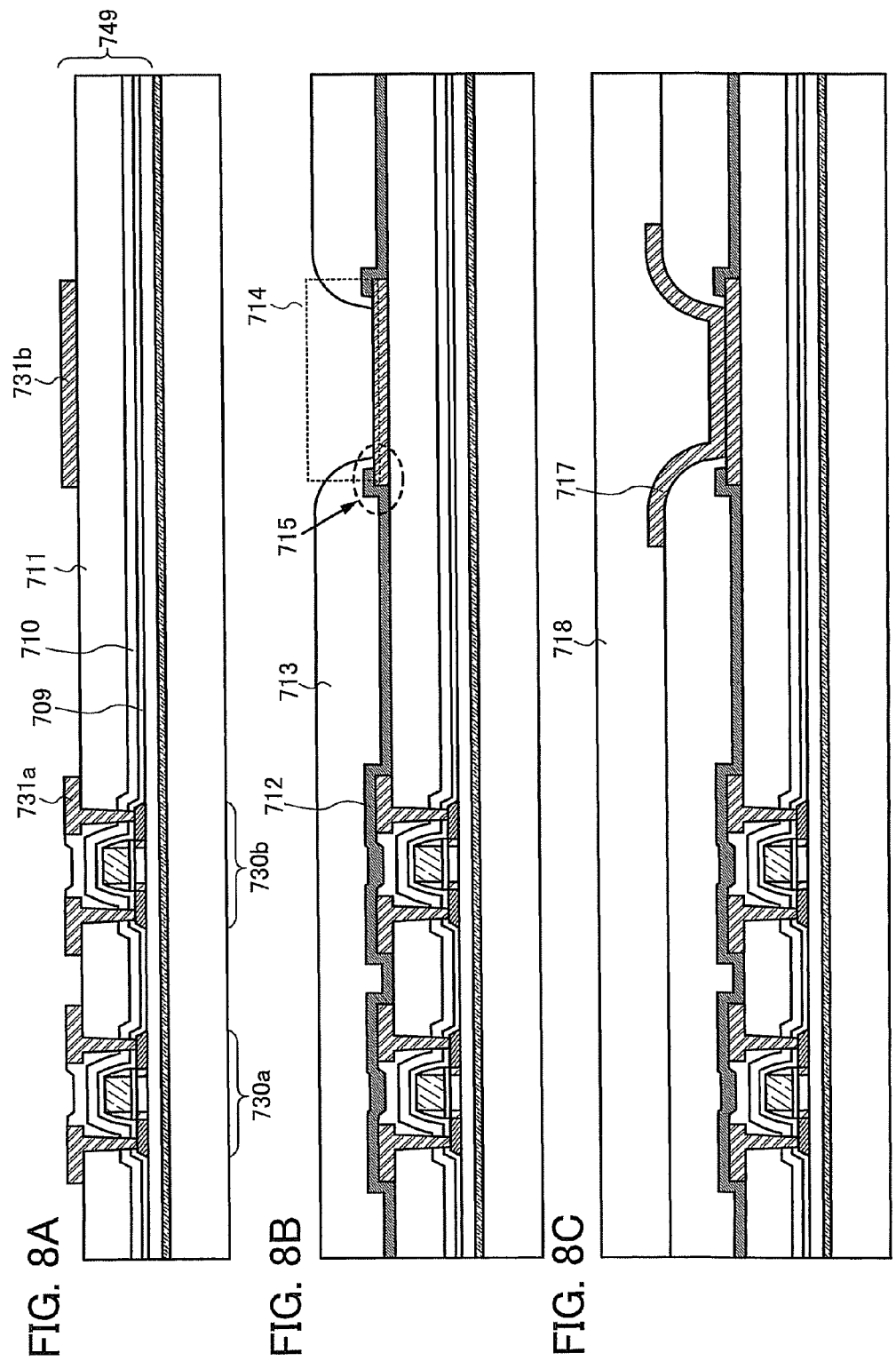

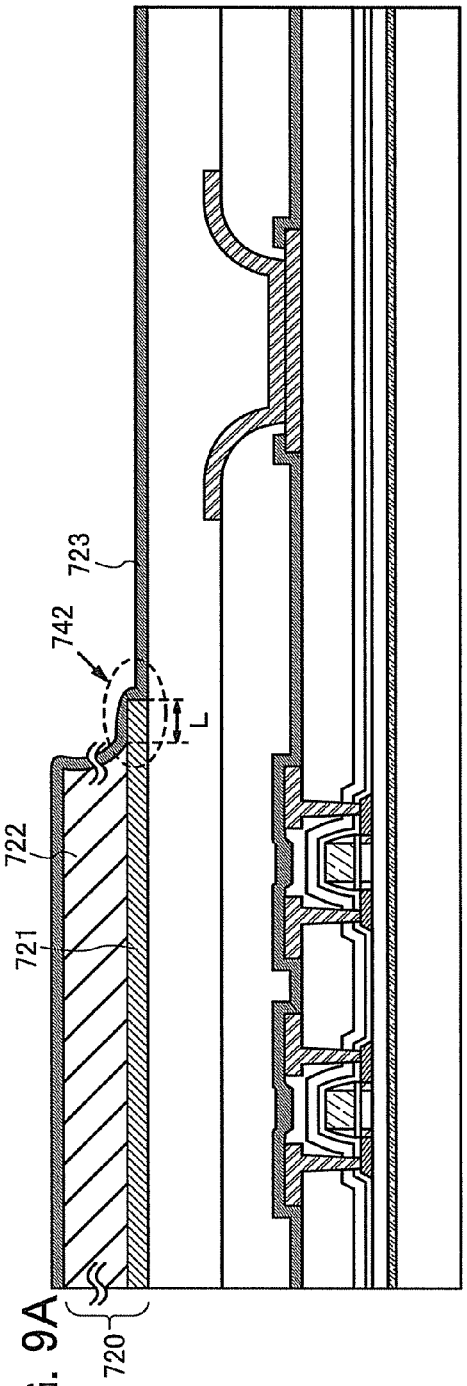
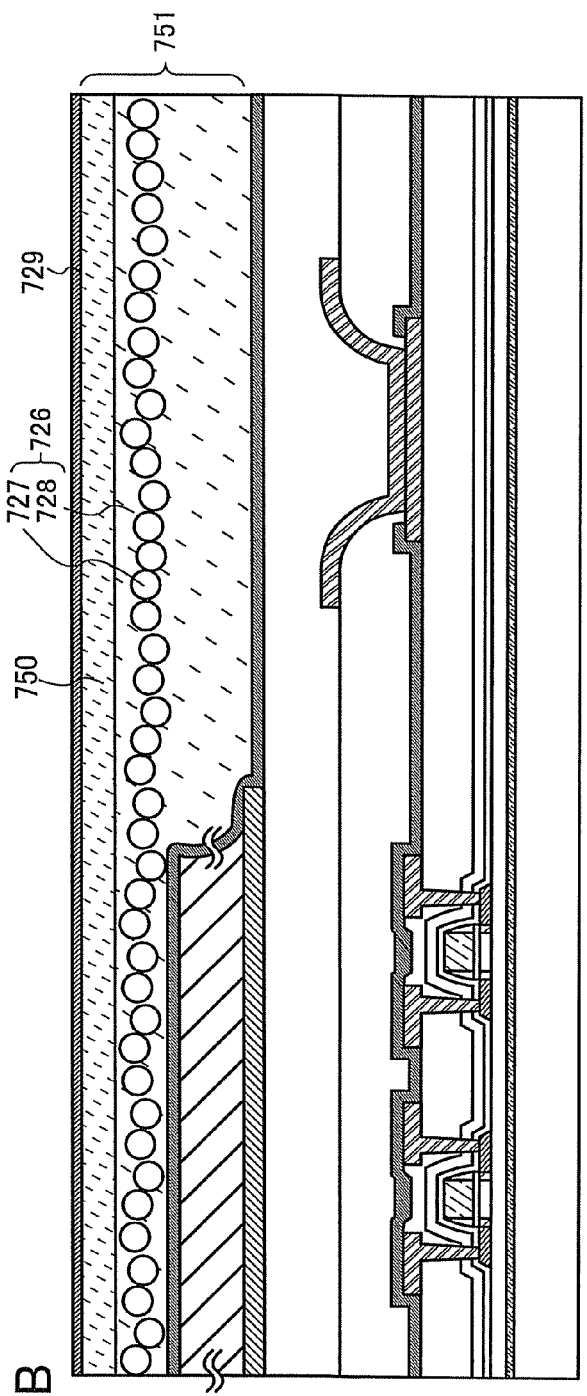
FIG. 9A
FIG. 9B

SEMICONDUCTOR DEVICE, ELECTRONIC APPLIANCE USING SEMICONDUCTOR DEVICE, AND DOCUMENT USING SEMICONDUCTOR DEVICE

TECHNICAL FIELD

The present invention relates to a semiconductor device capable of wireless communication.

Note that a semiconductor device in this specification refers to a device that can function by utilizing semiconductor characteristics.

BACKGROUND ART

Among electronic appliances that communicate wirelessly, electronic appliances which operate without wired power supply, such as a portable transceiver, a mobile phone, and a radio frequency identification system (RFID) tag have been particularly required to have as low power consumption as possible.

Among electronic appliances which operate without wired power supply, a potable transceiver and a mobile phone whose power sources are each a battery incorporated therein have been required to have as low power consumption as possible in order to increase time in which they can be used per charge.

In electronic appliances which operate without wired power supply, there are also an active RFID tag and a passive RFID tag. Since a passive RFID tag which does not incorporate a battery operates by electromagnetic waves from an interrogator, as power, the passive RFID tag is required to operate even when only a slight amount of power is generated in the case where a distance from the interrogator is increased and thus only weak electromagnetic waves can be received. Therefore, the passive RFID tag is particularly required to have low power consumption.

Here, an example is briefly described in which a passive RFID tag communicates wirelessly.

In the case where a passive RFID tag conducts reception through wireless communication, the passive RFID tag receives carrier waves which are electromagnetic waves transmitted from an interrogator by an antenna, converts the carrier waves into an AC signal, and rectifies the AC signal in a rectifier circuit, so that a DC voltage to be power is generated.

On the other hand, since data to be received by a passive RFID tag is transmitted through carrier waves modulated by a signal obtained by encoding the data in the interrogator, the passive RFID tag obtains data in such a manner that carrier waves are received by an antenna and the received carrier waves are demodulated into an encoded signal in a demodulation circuit. Further, in the case where the passive RFID tag is mounted with a clock synchronization-type logic circuit, in order to perform a process in accordance with the received data, the passive RFID tag generates a clock by dividing a frequency of an AC signal converted by the antenna into a desired frequency.

Further, the passive RFID tag makes each internal circuit operate with the generated voltage, performs a process in accordance with data received in synchronization with the generated clock, and responds to the interrogator if necessary.

Incidentally, when the passive RFID tag performs a process in accordance with received data, it decodes the encoded signal obtained by demodulation.

Among various ways for encoding, pulse interval encoding (PIE) is taken as an example here. By PIE, data of logical values 0 and 1 is encoded into signals with pulses generated at different time intervals. Examples of PIE are described with reference to FIGS. 2 and 3.

In FIG. 2, a signal 200 with a pulse generated at a short time interval is indicated as data of a logical value 0, and a signal 201 with a pulse generated at a long time interval is indicated as data of a logical value 1. FIG. 3 illustrates a signal 500 in the case where consecutive data, for example, 01011 is encoded.

The passive RFID tag determines the interval of time from the rise of a pulse to the next rise thereof by calculating the number of oscillation of a generated clock, in order to take data from the signal obtained by encoding by PIE, decodes the encoded signal into data of logical values 0 and 1 in accordance with the obtained number of oscillation, stores the encoded data in a storage element such as a register, and performs a process in accordance with the data.

As such a passive RFID tag which communicates wirelessly, for example, Non-Patent Document 1 is given.

REFERENCE

[Non-Patent Document 1] Design and Implementation of a Low-power Baseband-system for RFID Tag (2007 IEEE International Symposium on Circuits and Systems (pp. 1585-1588))

DISCLOSURE OF INVENTION

A passive RFID tag of Non-Patent Document 1 generates a plurality of clocks with different frequencies and uses them properly depending on a use. The passive RFID tag determines the pulse interval time by calculating the number of oscillation of one of the plurality of clocks which has the highest frequency obtained by dividing the frequency of carrier waves and decodes a signal encoded by PIE into data. Then, the passive RFID tag stores the data obtained by decoding in a register by using another clock having the lowest frequency of the plurality of clocks and performs a process in accordance with the data.

Thus, the passive RFID tag of Non-Patent Document 1 uses properly the generated plurality of clocks having different frequencies so that, in the step of decoding the encoded signal to obtain data, a clock having the highest frequency obtained by dividing the frequency of carrier waves is supplied to a function for which high-speed operation is needed and a clock having a relatively low frequency obtained by further dividing the frequency of the clock having the highest frequency is supplied to a function which is less likely to be influenced even if it takes time for a process, whereby power consumption is reduced.

However, the passive RFID tag of Non-Patent Document 1 has a problem in that there is a limit to reduction in power consumption because a clock having the highest frequency is generated by dividing the frequency of carrier waves and thus in a step for obtaining a clock having a desired frequency, a circuit that operates at a frequency the same as that of carrier waves exists in the passive RFID tag. Further, there is a problem in that power consumption is increased as a frequency of carrier waves is increased.

Still further, since the data obtained by decoding is stored in the register by using a clock having a relatively low frequency obtained by further dividing the frequency of a clock having the highest frequency, there is a problem in that the clock operates even when the data obtained by decoding is not required to be stored and thus power is wasted.

In view of the above problems, an object of an embodiment of the present invention is to provide a semiconductor device capable of wireless communication which has low power consumption in a step for decoding an encoded signal to obtain data.

To achieve the above object, a semiconductor device capable of wireless communication according to an embodiment of the present invention includes an antenna which converts received carrier waves into an AC signal, a rectifier circuit which rectifies the AC signal into a DC signal, a demodulation circuit which demodulates the AC signal into an encoded signal, a decoder circuit which decodes the encoded signal into a decoded signal, a unit which generates a clock signal having a certain frequency by supply of the DC voltage, a unit which generates a synchronized encoded signal by synchronizing the encoded signal demodulated from the AC signal with the clock signal, and a unit which stores data obtained by decoding the synchronized encoded signal in the decoder circuit, with the synchronized encoded signal utilized as a clock.

The semiconductor device capable of wireless communication according to an embodiment of the present invention may include a constant voltage circuit which stabilizes a DC voltage output from the rectifier circuit and outputs the stabilized DC voltage in addition to the above structure.

As for a semiconductor device capable of wireless communication according to an embodiment of the present invention, a unit which generates a clock having a certain frequency by supply of a DC voltage generates a clock having a frequency lower than the frequency of carrier waves, with which an encoded signal can be decoded; thus, a circuit which operates at a frequency of carrier waves and a frequency-dividing circuit which generates a desired clock can be unnecessary.

Further, in a unit which generates a synchronized encoded signal by synchronizing the encoded signal demodulated from the AC signal with a clock, the demodulated encoded signal is synchronized with the clock generated in the semiconductor device, whereby the synchronized encoded signal is utilized as a clock for storing data obtained by decoding the synchronized encoded signal; thus, a clock for storing data obtained by decoding, which operates constantly, can be unnecessary. Accordingly, power consumption can be reduced, which significantly contributes to increase in distance within which wireless communication with an interrogator is performed.

BRIEF DESCRIPTION OF DRAWINGS

In the accompanying drawings:
FIGS. 8A to 8C illustrate one mode of Embodiment 2;
FIGS. 9A and 9B illustrate one mode of Embodiment 2.

BEST MODE FOR CARRYING OUT THE INVENTION

Embodiments of the present invention are described with reference to the drawings.
(Embodiment 1)
An embodiment of the present invention is described below. Here, a passive RFID tag is given as a typical example of a semiconductor device capable of wireless communication according to an embodiment of the present invention.

Figure 1:
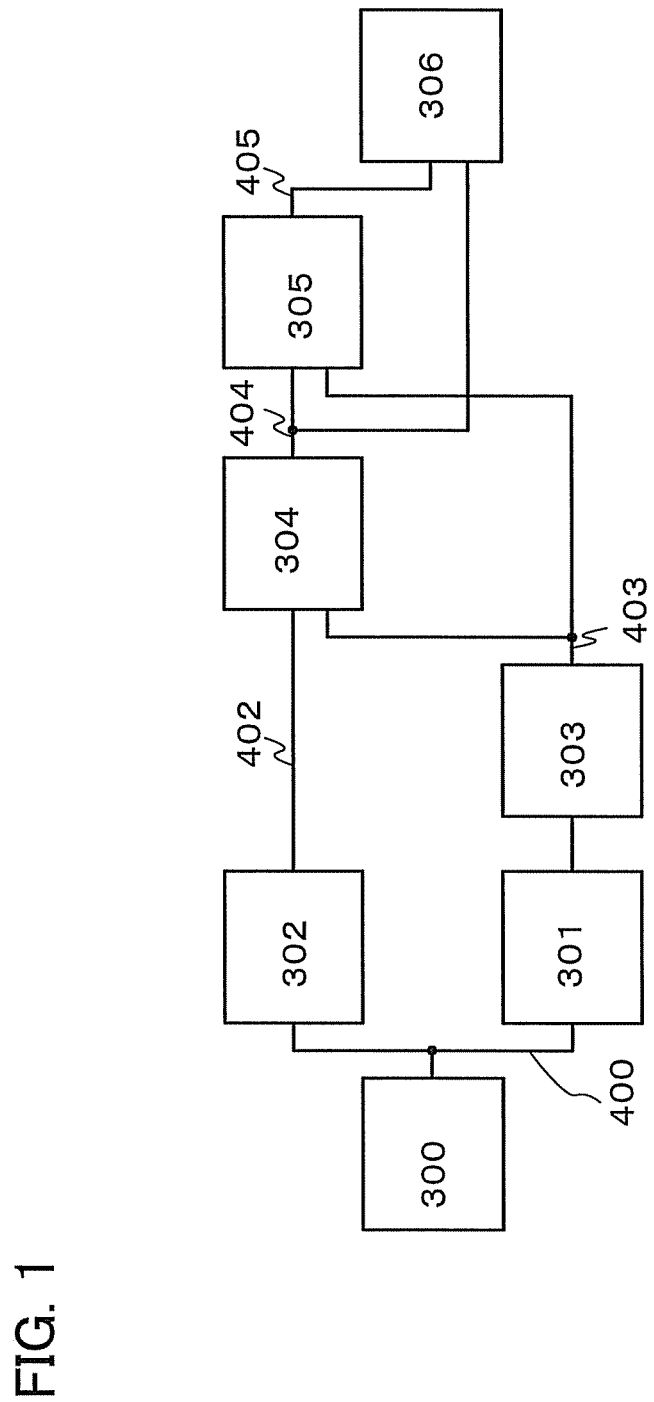
FIG. 1 illustrates one mode of Embodiment 1.
Figure 2:
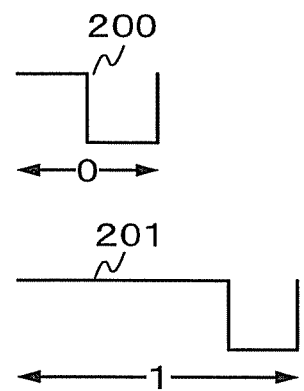
FIG. 2 illustrates PIE.
Figure 3:
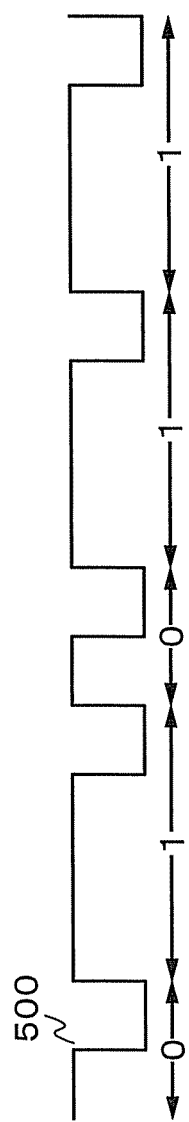
FIG. 3 illustrates PIE.

FIG. 1 illustrates a structure necessary for a passive RFID tag according to an embodiment of the present invention from when receiving carrier waves to when storing data. The passive RFID tag according to an embodiment of the present invention includes an antenna 300, a rectifier circuit 301, a demodulation circuit 302, an oscillator circuit 303, a synchronization circuit 304, a decoder circuit 305, and a register 306. Note that reference numerals of input/output signals in FIG. 1 correspond to reference numerals of a time chart in FIG. 4.

The antenna 300 converts received carrier waves into an AC signal. The rectifier circuit 301 rectifies the AC signal into a DC signal applied as a power supply voltage of the RFID tag. The demodulation circuit 302 demodulates the AC signal into an encoded signal. The oscillator circuit 303 generates a clock signal having a certain frequency by supply of the power supply voltage. The synchronization circuit 304 generates a synchronized encoded signal obtained by synchronizing the encoded signal with the clock signal. The decoder circuit 305 decodes the synchronized encoded signal into received data. The register 306 stores the received data.

Figure 4:
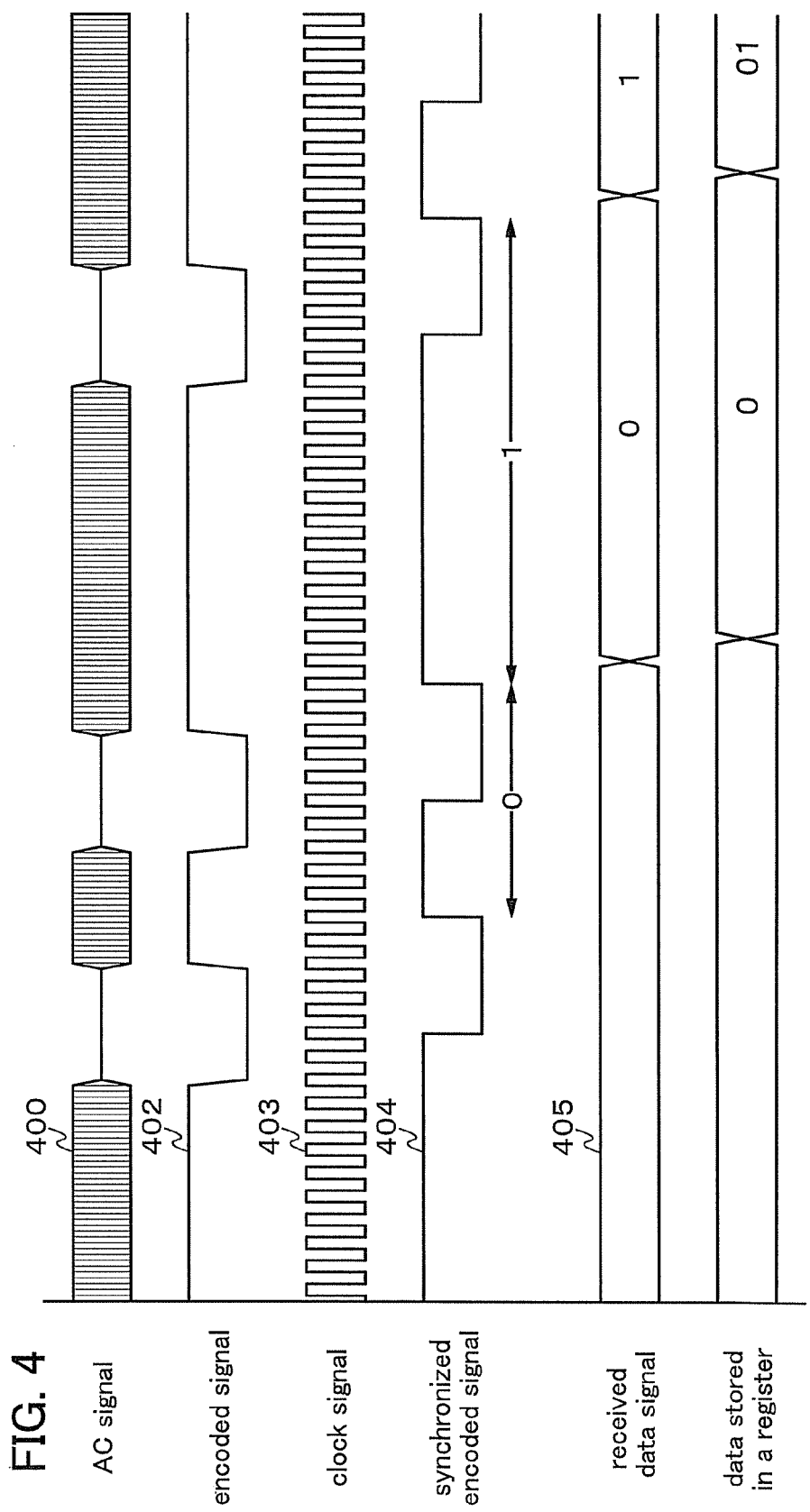
FIG. 4 illustrates one mode of Embodiment 1.

FIG. 4 is a time chart illustrating operations of a passive RFID tag according to an embodiment of the present invention from when receiving carrier waves to when storing data. The operations of the passive RFID tag according to an embodiment of the present invention are described below with reference to FIG. 4. Note that the time chart of FIG. 4 illustrates the case where enough time has passed until a power supply voltage rises and is stabilized since carrier waves were received.

When the passive RFID tag receives carrier waves, the antenna 300 converts the received carrier waves into an AC signal 400 and outputs it.

The rectifier circuit 301 rectifies the AC signal 400 into a DC voltage and supplies power as a power supply voltage to each circuit in the passive RFID tag. Note that although the DC voltage which is an output signal of the rectifier circuit 301, that is, a power supply voltage is input only to the oscillator circuit 303 in FIG. 1 for simplicity, the DC voltage is actually input to each circuit in the passive RFID tag.

The demodulation circuit 302 demodulates the AC signal 400 into an encoded signal 402 and outputs the encoded signal 402 to the synchronization circuit 304.

By supply of the power supply voltage, the oscillator circuit 303 generates a clock signal 403 having a certain oscillation frequency which is lower than a frequency of carrier waves and high enough that the encoded signal can be decoded and outputs the clock signal 403 to the synchronization circuit 304 and the decoder circuit 305.

The synchronization circuit 304 synchronizes the demodulated encoded signal 402 with the clock signal 403 and outputs a synchronized encoded signal 404 to the decoder circuit 305 and the register 306.

Figure 5:
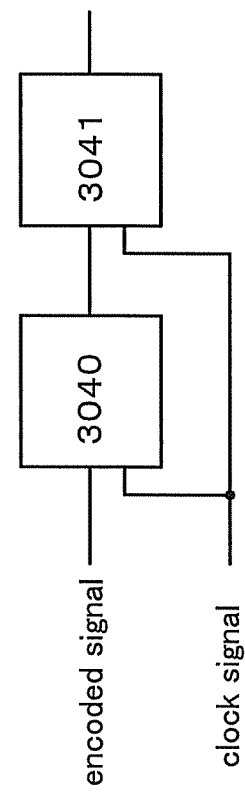
FIG. 5 illustrates one mode of Embodiment 1.

Here, an example of the circuit configuration of the synchronization circuit 304 is illustrated in FIG. 5 and operations of the synchronization circuit 304 are described. This circuit configuration includes flip-flops 3040 and 3041. An output signal of the flip-flop 3040 is input to an input terminal of the flip-flop 3041 and the clock signal 403 is input to both of the flip-flops 3040 and 3041 as a trigger for taking an input signal. Although the flip-flop 3040 takes the encoded signal 402 which is the input signal in synchronization with the clock signal 403, the flip-flop 3040 may output a signal whose voltage is unstable since the encoded signal 402 is not synchronized with the clock signal 403. Therefore, the structure is employed in which the cycle of the clock signal 403 is set to be longer than the time needed for the voltage of the signal which may be output from the flip-flop 3040 to be stablilized, in order that the flip-flop 3041 can take only the signal which is output from the flip-flop 3040 and whose voltage is stable. With such a circuit configuration, the synchronization circuit 304 outputs the synchronized encoded signal 404 which is obtained by synchronization with the clock signal 403 and whose voltage is stable.

The decoder circuit 305 determines the interval of time from the rise of a pulse of the synchronized encoded signal 404 to the rise of the next pulse_by calculating the number of oscillation of the clock signal 403, compares the lengths of determined time to decode the synchronized encoded signal 404 into received data of logical values 0 or 1 (referred to as digital signals), and outputs a received data signal 405. In this time chart, the received data is fixed at the timing when the clock signal 403 rises immediately after the next pulse of the synchronized encoded signal 404 rises, and the received signal data 405 is output. The edge of rise of the synchronized encoded signal 404 triggers the register 306 to store the decoded received data. In this time chart, the register 306 stores the decoded received data at the edge of rise of a pulse of a signal delayed by two cycles of the clock signal 403 from the edge of rise of the synchronized encoded signal 404. Accordingly, by delaying the synchronized encoded signal 404 by two cycles of the clock signal 403, the time needed for stabilizing an output voltage of the received data signal 405 is provided and data which is the stabilized voltage is stored in the register 306.

Figure 6:
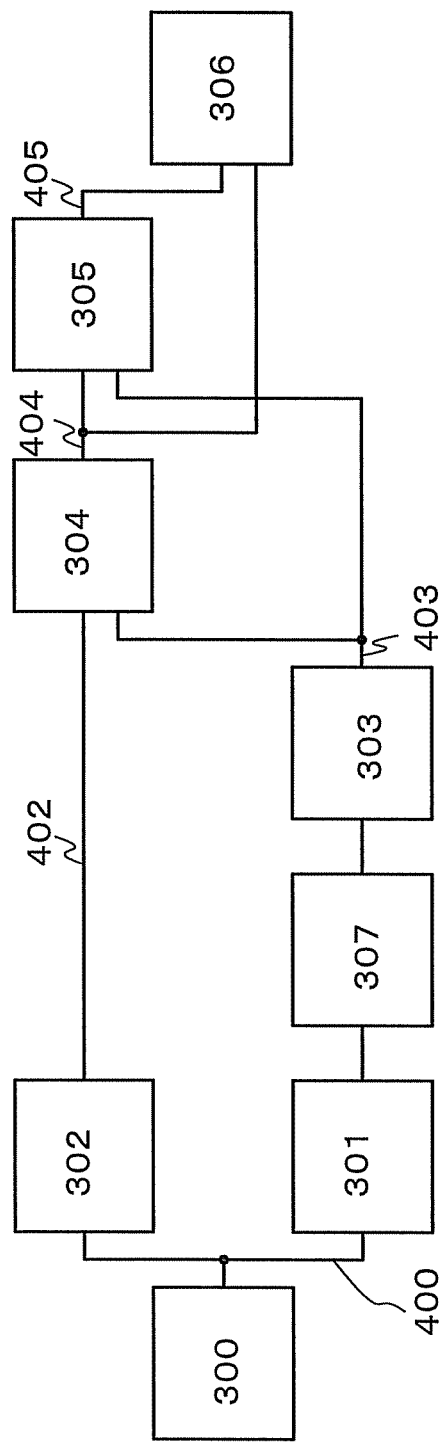
FIG. 6 illustrates one mode of Embodiment 1.

FIG. 6 illustrates the configuration of a passive RFID tag according to an embodiment of the present invention in which a constant voltage circuit 307 is additionally provided between the rectifier circuit 301 and the oscillation circuit 303 in FIG. 1. Note that reference numerals of the input and output signals in FIG. 1 corresponds to those in the time chart of FIG. 4.

The constant voltage circuit 307 outputs a constant DC voltage applied as a power supply voltage of the passive RFID tag even when a DC voltage output from the rectifier circuit 301 is fluctuated due to a change in communication distance between an interrogator and the passive RFID tag, a change in temperature of an environment where the passive RFID tag exists, or the like. By additionally providing the constant voltage circuit 307, a stable power supply voltage can be supplied to the oscillator circuit 303 and the oscillator circuit 303 can also generate and output the clock signal 403 with a stable oscillation frequency. Note that in the case of additionally providing the constant voltage circuit 307, an output signal of the rectifier circuit 301 is input only to the constant voltage circuit 307, and a DC voltage applied as a power supply voltage, which is an output signal of the constant voltage circuit 307, is input to each circuit in the passive RFID tag.

According to this embodiment described above, since the operation timing when the register stores received data is determined using the synchronized encoded signal, a circuit which operates depending on a frequency of carrier waves and a frequency divider circuit which generates a desired clock can be unnecessary and a clock for storing a decoded signal, which operates constantly, can be unnecessary. Therefore, power consumption can be reduced, which contributes to increase in distance for wireless communication with an interrogator.

Although a passive RFID tag is given as an example here, it can be easily guessed that this embodiment can be applied to any other electronic appliance as long as it communicates data in a similar manner.

(Embodiment 2)

In this embodiment, a method for manufacturing the semiconductor device described in the above embodiment is described.

Figure 7A:
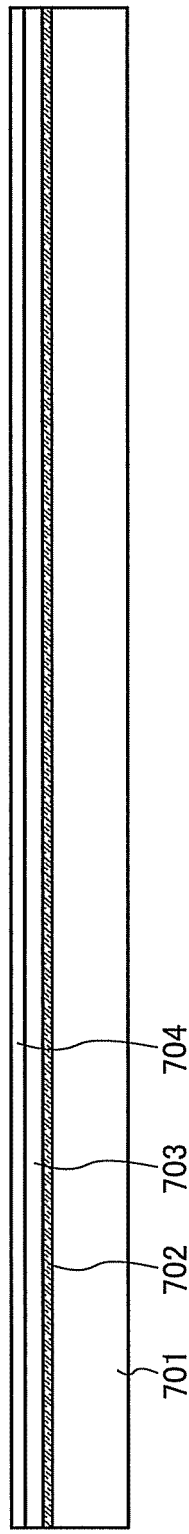
FIGS. 7A to 7C illustrate one mode of Embodiment 2.

First, a separation layer 702 is formed over one surface of a substrate 701, and then an insulating film 703 to be a base and a semiconductor film 704 (for example, a film containing amorphous silicon) are formed (see FIG. 7A). The separation layer 702, the insulating film 703, and the semiconductor film 704 can be successively formed. Being formed successively, they are not exposed to the air and thus entry of an impurity can be prevented.

As the substrate 701, a glass substrate, a quartz substrate, a metal substrate, a stainless steel substrate, a plastic substrate which has heat resistance to a process temperature in this process, or the like is preferably used. Such a substrate has no significant limitation on its area or its shape. Thus, for example, in the case of using a substrate which has a rectangular shape with a side length of 1 meter or longer, productivity can be significantly increased. Such a merit is greatly advantageous as compared to a case of using a circular silicon substrate. Therefore, even in a case of forming a circuit portion larger, the cost can be low as compared to the case of using a silicon substrate.

Note that while the separation layer 702 is formed over an entire surface of the substrate 701 in this process, the separation layer 702 may be selectively formed as necessary by a photolithography method after a separation layer is formed over the entire surface of the substrate 701. Further, while the separation layer 702 is formed so as to be in contact with the substrate 701, it is also allowed that an insulating film such as a silicon oxide film, a silicon oxynitride film, a silicon nitride film, or a silicon nitride oxide film is formed so as to be in contact with the substrate 701 and the separation layer 702 is formed so as to be in contact with the insulating film, as necessary.

Here, an oxynitride refers to a substance containing oxygen and nitrogen so that the amount of oxygen is larger than that of nitrogen, and a nitride oxide refers to a substance containing oxygen and nitrogen so that the amount of nitrogen is larger than that of oxygen. For example, silicon oxynitride is a substance containing oxygen, nitrogen, silicon, and hydrogen at from 50 at. % to 70 at. %, from 0.5 at. % to 15 at. %, from 25 at. % to 35 at. %, and from 0.1 at. % to 10 at. %, respectively. Further, silicon nitride oxide is a substance containing oxygen, nitrogen, silicon, and hydrogen at from 5 at. % to 30 at. %, from 20 at. % to 55 at. %, from 25 at. % to 35 at. %, and from 10 at. % to 30 at. %, respectively. It is to be noted that the above ranges are obtained by measurement using Rutherford backscattering spectrometry (RBS) or hydrogen forward scattering spectrometry (HFS). Further, the total of the content rate of the constituent elements does not exceed 100 at. %.

As the separation layer 702, a metal film, a layered structure of a metal film and a metal oxide film, or the like can be used. The metal film is formed to have a single-layer structure or a layered structure using a film formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), an alloy material containing any of the above elements as its main component, or a compound material containing any of the above elements as its main component. The metal film can be formed by a sputtering method, various CVD methods such as a plasma CVD method, or the like. As the layered structure of a metal film and a metal oxide film, after the above metal film is formed, an oxide or oxynitride of the metal film can be formed on the surface of the metal film by performing plasma treatment in an oxygen atmosphere or an $N_2O$ atmosphere, or heat treatment in an oxygen atmosphere or an $N_2O$ atmosphere. Alternatively, a metal film is formed and then a surface thereof is treated with a highly oxidative solution such as an ozone solution, so that an oxide or oxynitride of the metal film can be formed on the surface of the metal film.

The insulating film 703 is formed to have a single-layer structure or a layered structure using a film containing an oxide of silicon or a nitride of silicon by a sputtering method, a plasma CVD method, or the like. In the case where the insulating film to be a base has a two-layer structure, a silicon nitride oxide film may be formed for a first layer, and a silicon oxynitride film may be formed for a second layer, for example. In the case where the insulating film to be a base has a three-layer structure, a silicon oxide film, a silicon nitride oxide film, and a silicon oxynitride film may be formed for a first layer, a second layer, and a third layer, respectively. Alternatively, a silicon oxynitride film, a silicon nitride oxide film, and a silicon oxynitride film may be formed for a first layer, a second layer, and a third layer, respectively. The insulating film 703 to be a base functions as a blocking film for preventing impurities from entering from the substrate 701.

The semiconductor film 704 is formed to a thickness of from 25 nm to 200 nm, preferably from 50 nm to 70 nm, specifically 66 nm by a sputtering method, an LPCVD method, a plasma CVD method, or the like. As the semiconductor film 704, an amorphous silicon film may be formed, for example.

Figure 7B:
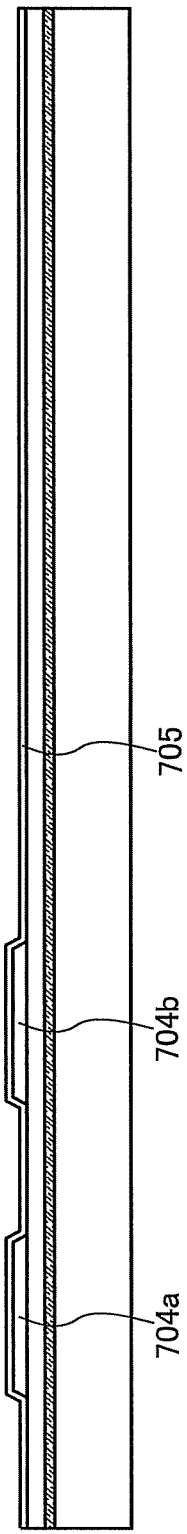

Next, the semiconductor film 704 is crystallized by laser beam irradiation. Note that the semiconductor film 704 may be crystallized by a method in which laser beam irradiation is combined with a thermal crystallization method using an RTA or an annealing furnace, or a thermal crystallization method using a metal element for promoting crystallization, or the like. After that, the obtained crystalline semiconductor film is etched so as to have a desired shape, so that semiconductor films 704a and 704b are formed. Then, a gate insulating film 705 is formed so as to cover the semiconductor films 704a and 704b (see FIG. 7B).

An example of a manufacturing step of the semiconductor films 704a and 704b is briefly described below. First, an amorphous semiconductor film (for example, an amorphous silicon film) is formed by a plasma CVD method. Next, a solution containing nickel that is a metal element for promoting crystallization is retained on the amorphous semiconductor film, and dehydrogenation treatment (at 500° C., for one hour) and thermal crystallization treatment (at 550° C., for four hours) are performed on the amorphous semiconductor film, so that a crystalline semiconductor film is formed. After that, the crystalline semiconductor film is irradiated with a laser beam from a laser, and a photolithography method is used, as needed, depending on the degree of crystallization, so that the semiconductor films 704a and 704b are formed.

Note that without being subjected to the thermal crystallization which uses the metal element for promoting crystallization, the amorphous semiconductor film may be crystallized only by laser beam irradiation.

Alternatively, the semiconductor film may be scanned in one direction for crystallization while being irradiated with a continuous wave laser beam or a laser beam oscillated at a repetition rate of 10 MHz or higher, to form the semiconductor films 704a and 704b. In the case of such crystallization, crystals grow in a direction of scanning the laser beam. A transistor may be provided so that its channel length direction (the direction in which carriers flow when a channel formation region is formed) is aligned with the scanning direction.

Next, a gate insulating film 705 which covers the semiconductor films 704a and 704b is formed. The gate insulating film 705 is formed to have a single-layer structure or a layered structure using a film containing an oxide of silicon or a nitride of silicon by a CVD method, a sputtering method, or the like. In specific, the gate insulating film 705 is formed to have a single-layer structure or a layered structure using a silicon oxide film, a silicon oxinitride film, or a silicon nitride oxide film.

Alternatively, the gate insulating film 705 may be formed by performing plasma treatment on the semiconductor films 704a and 704b to oxidize or nitride surfaces thereof. For example, the gate insulating film 705 is formed by plasma treatment introducing a mixed gas of a rare gas such as He, Ar, Kr, or Xe and oxygen, nitrogen oxide ($NO_2$), ammonia, nitrogen, hydrogen, or the like. When excitation of the plasma in this case is performed by introduction of a microwave, plasma with a low electron temperature and high density can be generated. By an oxygen radical (there is a case where an OH radical is included) or a nitrogen radical (there is a case where an NH radical is included) generated by this high-density plasma, the surfaces of the semiconductor films can be oxidized or nitrided.

By treatment using such high-density plasma, an insulating film having a thickness of from about 1 nm to about 20 nm, typically from about 5 nm to about 10 nm, is formed over the semiconductor films. Since the reaction of this case is a solid-phase reaction, interface state density between the insulating film and each semiconductor film can be extremely low. Since such high-density plasma treatment oxidizes (or nitrides) a semiconductor film (crystalline silicon or polycrystalline silicon) directly, unevenness of a thickness of the insulating film to be formed can be extremely small. In addition, oxidation does not proceed even at a crystal grain boundary of crystalline silicon, which makes a very preferable condition. That is, by a solid-phase oxidation of the surfaces of the semiconductor films by the high-density plasma treatment described here, an insulating film with favorable uniformity and low interface state density can be formed without abnormal oxidation reaction at a crystal grain boundary.

As the gate insulating film 705, an insulating film formed by plasma treatment may be used by itself, or an insulating film of silicon oxide, silicon oxynitride, silicon nitride, or the like may be formed thereover by a CVD method using plasma or thermal reaction, so as to make stacked layers. In any case, transistors each including an insulating film formed by plasma treatment, in a part of the gate insulating film or in the whole gate insulating film, can reduce variation in the characteristics, which is preferable.

Further, in the case where a semiconductor film is scanned in one direction for crystallization while being irradiated with a continuous wave laser beam or a laser beam oscillated at a repetition rate of 10 MHz or higher, so that the semiconductor films 704a and 704b are formed, by combining any of such gate insulating films subjected to plasma treatment, thin film transistors (TFTs) having small characteristic variations and high field effect mobility can be obtained.

Next, a conductive film is formed over the gate insulating film 705. Here, the conductive film is formed as a single layer to a thickness of from about 100 nm to about 500 nm. The conductive film is formed using a material containing an element selected from tantalum (Ta), tungsten (W), titanium (Ti), molybdenum (Mo), aluminum (Al), copper (Cu), chromium (Cr), niobium (Nb), and the like; an alloy material containing any of the above elements as its main component; or a compound material containing any of the above elements as its main component. Alternatively, the conductive film may be formed using a semiconductor material typified by polycrystalline silicon to which an impurity element such as phosphorus is added. In the case where the conductive film is formed to have a layered structure, a layered structure of a tantalum nitride film and a tungsten film, a layered structure of a tungsten nitride film and a tungsten film, a layered structure of a molybdenum nitride film and a molybdenum film, or the like can be employed. For example, a layered structure of a 30 nm tantalum nitride film and a 150 nm tungsten film can be employed. Since tungsten and tantalum nitride have high heat resistance, heat treatment for thermal activation can be performed after the conductive film is formed. Alternatively, the conductive film may have a three-layer structure and for example, a layered structure of a molybdenum film, an aluminum film, and a molybdenum film can be employed.

Next, a resist mask is formed over the conductive film by a photolithography method, and etching treatment for forming a gate electrode and a gate wiring is performed, so that gate electrodes 707 are formed over the semiconductor films 704a and 704b.

Next, a resist mask is formed by a photolithography method, and an impurity element imparting n-type or p-type conductivity is added to the semiconductor films 704a and 704b at low concentration by an ion doping method or an ion implantation method. In this embodiment, an impurity element imparting n-type conductivity is added to the semiconductor films 704a and 704b at low concentration. As an impurity element imparting n-type conductivity, an element which belongs to Group 15, such as phosphorus (P) or arsenic (As), may be used. Further, as an impurity element imparting p-type conductivity, an element which belongs to Group 13, such as boron (B), may be used.

Note that only n-channel TFTs are described in this embodiment for simplicity; however, the present invention is not construed as being limited thereto. Alternatively, only p-channel TFTs may be used. Still alternatively, n-channel TFTs and p-channel TFTs may be formed in combination. In the case where n-channel TFTs and p-channel TFTs are formed in combination, a mask covering semiconductor layers that are to be included in p-channel TFTs is formed to add an impurity element imparting n-type conductivity, and a mask covering semiconductor layers that are to be included in n-channel TFTs is formed to add an impurity element imparting p-type conductivity, whereby the impurity element imparting n-type conductivity and the impurity element imparting p-type conductivity can be selectively added.

Next, an insulating film is formed so as to cover the gate insulating film 705 and the gate electrodes 707. The insulating film is formed to have a single-layer structure or a layered structure using a film containing an inorganic material such as silicon, an oxide of silicon, or a nitride of silicon, or a film containing an organic material such as an organic resin by a plasma CVD method, a sputtering method, or the like. Next, the insulating film is selectively etched by anisotropic etching mainly in a perpendicular direction, so that insulating films 708 (also referred to as side walls) which are in contact with side surfaces of the gate electrodes 707 are formed. The insulating films 708 are used as masks for adding an impurity element when LDD (lightly doped drain) regions are formed later.

Figure 7C:
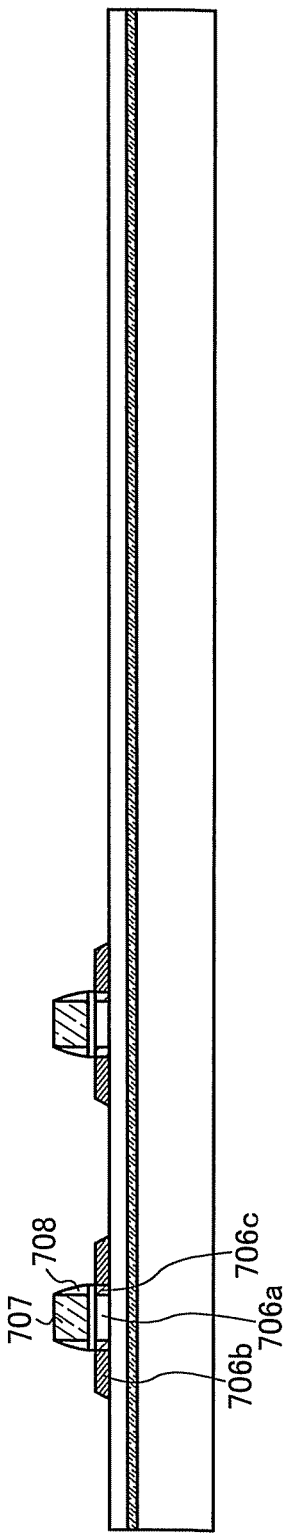

Next, a resist mask formed by a photolithography method, the gate electrodes 707, and the insulating films 708 are used as masks to add an impurity element imparting n-type conductivity to the semiconductor films 704a and 704b, so that channel formation regions 706a, first impurity regions 706b, and second impurity regions 706c are formed (see FIG. 7C). The first impurity regions 706b function as source and drain regions of the thin film transistor, and the second impurity regions 706c function as LDD regions. The concentration of the impurity element contained in the second impurity regions 706c is lower than that of the impurity element contained in the first impurity regions 706b.

Then, an insulating film having a single-layer structure or a layered structure is formed so as to cover the gate electrodes 707, the insulating films 708, and the like. In this embodiment, the case where the insulating films 709, 710, and 711 have a three-layer structure is described as an example. These insulating films can be formed by a CVD method. A silicon oxynitride film having a thickness of 50 nm, a silicon nitride oxide film having a thickness of 200 nm, and a silicon oxynitride film having a thickness of 400 nm can be formed as the insulating film 709, the insulating film 710, and the insulating film 711, respectively. The insulating films are, although depending on the thicknesses, formed so that surfaces of the insulating films are along the surface of the layers provided therebelow. That is to say, since the insulating film 709 has a small thickness, the surface of the insulating film 709 closely corresponds to the surfaces of the gate electrodes 707. As the thickness of the film is larger, its surface is more planar; therefore, the surface of the insulating film 711 whose thickness is the largest of the three films is almost planar. However, unlike an organic material, the insulating film 711 does not have a planar surface. That is, if the surface of the insulating film 711 is desired to be planar, an organic material such as polyimide, polyamide, benzocyclobutene, acrylic, or epoxy; a siloxane material; or the like may be used. Further, as a formation method of these insulating films, a sputtering method, an SOG method, a droplet discharge method, a screen printing method, or the like may be employed instead of a CVD method.

Then, the insulating films 709, 710, and 711, and the like are etched using a photolithography method to form contact holes reaching the first impurity regions 706b. Then, conductive films 731a serving as source and drain electrodes of the thin film transistors and a conductive film 731b serving as a connecting wiring are formed. The conductive films 731a and the conductive film 731b can be formed in such a manner: a conductive film is formed so as to fill the contact holes and then the conductive film is selectively etched. Note that before the conductive film is formed, a silicide may be formed over the surfaces of the semiconductor films 704a and 704b that are exposed by the contact holes to reduce resistance. The conductive films 731a and the conductive film 731b are preferably formed using a low resistance material in order to reduce signal delay. Since a low resistance material often has low heat resistance, a high heat resistance material is preferably provided over and below the low resistance material. For example, a structure is preferable in which an aluminum film, which is a low resistance material, is formed to a thickness of 300 nm and titanium films each having a thickness of 100 nm are formed over and below the aluminum film. Further, when the conductive film 731*b*, which serves as a connecting wiring, is formed to have the same layered structure as the conductive films 731*a*, resistance of the connecting wiring can be lowered and heat resistance of the connecting wiring can be increased. The conductive films 731*a* and the conductive film 731*b* can be formed to have a single-layer structure or a layered structure using any of other conductive materials, for example, a material containing an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material containing any of these elements as its main component; or a compound material containing any of these elements as its main component. An alloy material containing aluminum as its main component corresponds to, for example, a material which contains aluminum as its main component and which also contains nickel, or an alloy material which contains aluminum as its main component and which also contains nickel and one or both of carbon and silicon. The conductive films 731*a* and the conductive film 731*b* can be formed by a CVD method, a sputtering method, or the like.

Accordingly, an element layer 749 including a thin film transistor 730*a* and a thin film transistor 730*b* can be obtained (see FIG. 8A).

Note that heat treatment for repairing crystallinity of the semiconductor film 704, activating the impurity element which is added to the semiconductor film 704, and hydrogenating the semiconductor film 704 may be performed before the insulating films 709, 710, and 711 are formed; after the insulating film 709 is formed; or after the insulating films 709 and 710 are formed. For the heat treatment, a thermal annealing method, a laser annealing method, an RTA method, or the like may be employed.

Next, insulating films 712 and 713 are formed so as to cover the conductive films 731*a* and the conductive film 731*b* (see FIG. 8B). The case where a silicon nitride film having a thickness of 100 nm is used for the insulating film 712 and a polyimide film having a thickness of 1500 nm is used for the insulating film 713 is described as an example. It is preferable that a surface of the insulating film 713 have high planarity. Therefore, the planarity of the insulating film 713 is improved by making the film have a large thickness of, for example, from 750 nm to 3000 nm, (specifically, 1500 nm) in addition to the characteristics of polyimide, which is an organic material. An opening is formed in the insulating films 712 and 713. In this embodiment, the case where an opening 714 exposing the conductive film 731*b* is formed is described as an example. In the opening 714 (specifically, in a region 715 surrounded by a dotted line), an end portion of the insulating film 712 is covered with the insulating film 713. By covering the end portion of the lower insulating film 712 with the upper insulating film 713, breakage of a wiring to be formed later in the opening 714 can be prevented. In this embodiment, since the insulating film 713 is formed using polyimide which is an organic material, the insulating film 713 can have a gently tapered shape in the opening 714, and thus breakage can be efficiently prevented. As a material for the insulating film 713 with which such an effect of preventing breakage can be obtained, an organic material such as polyamide, benzocyclobutene, acrylic, or epoxy; a siloxane material; or the like can be given in addition to polyimide. Further, as the insulating film 712, a silicon oxynitride film or a silicon nitride oxide film may be used instead of the silicon nitride film. As a formation method of the insulating films 712 and 713, a CVD method, a sputtering method, an SOG method, a droplet discharge method, a screen printing method, or the like can be used.

Next, a conductive film 717 is formed over the insulating film 713, and an insulating film 718 is formed over the conductive film 717 (see FIG. 8C). The conductive film 717 can be formed using the same material as the conductive films 731*a* and the conductive film 731*b*, and for example, a layered structure of a 200 nm titanium film, a 200 nm aluminum film, and a 100 nm titanium film can be employed. Since the conductive film 717 is connected to the conductive film 731*b* in the opening 714, the films formed using titanium are in contact with each other, whereby contact resistance can be suppressed. In addition, since a current based on a signal between the thin film transistor and an antenna (formed later) flows in the conductive film 717, wiring resistance of the conductive film 717 is preferably low. Therefore, a low resistance material such as aluminum is preferably used. The conductive film 717 can be formed to have a single-layer structure or a layered structure, using any of other conductive materials: for example, a material containing an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material containing any of these elements as its main component; or a compound material containing any of these elements as its main component. An alloy material containing aluminum as its main component corresponds to, for example, a material which contains aluminum as its main component and which also contains nickel, or an alloy material which contains aluminum as its main component and which also contains nickel and one or both of carbon and silicon. The conductive film 717 can be formed by a CVD method, a sputtering method, or the like. The insulating film 718 should have a planar surface and therefore is preferably formed using an organic material. Here, the case where a 2000 nm polyimide film is used for the insulating film 718 is described as an example. The insulating film 718 is formed to have a thickness of 2000 nm, which is larger than the thickness of the insulating film 713, because projections and depressions formed by the surfaces of the opening 714 of the insulating film 713 having a thickness of 1500 nm and the conductive film 717 formed in the opening 714 should be planarized. Therefore, the insulating film 718 preferably has a thickness 1.1 to 2 times, preferably, 1.2 to 1.5 times the thickness of the insulating film 713. When the insulating film 713 has a thickness of from 750 nm to 3000 nm, the insulating film 718 preferably has a thickness of from 900 nm to 4500 nm. The insulating film 718 is preferably formed using a material with which planarity can be improved in consideration of the thickness of the insulating film 718. As a material for the insulating film 718 with which the planarity can be improved, an organic material such as polyamide, benzocyclobutene, acrylic, or epoxy; a siloxane material; or the like can be given in addition to polyimide. In the case where an antenna is formed over the insulating film 718, as described above, the planarity of the surface of the insulating film 718 should be taken into consideration.

Figure 12:
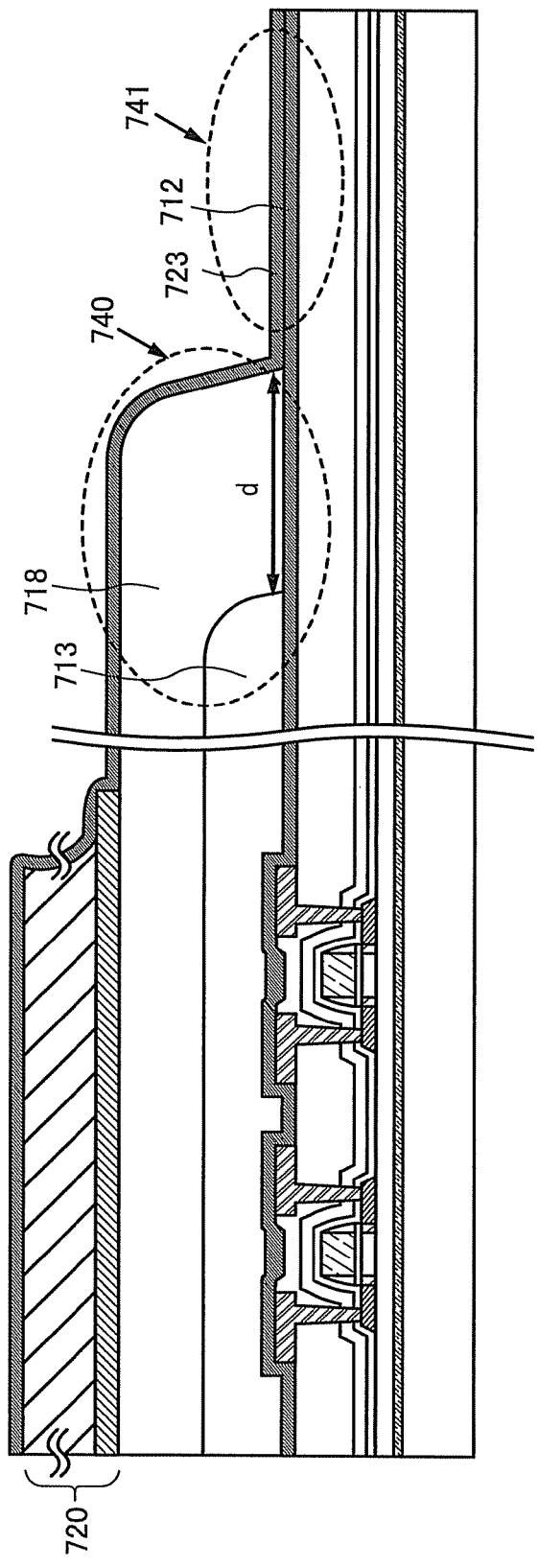
FIG. 12 illustrates one mode of Embodiment 2.

FIG. 12 illustrates the peripheral portion of the semiconductor device. The insulating film 718 preferably covers an end portion of the insulating film 713 outside the antenna in a circuit portion (specifically, in a region 740). When the insulating film 718 covers the insulating film 713, it is preferable that the end of the insulating film 718 is located away from the end of the insulating film 713 by a distance (a distance d) two or more times the total thickness of the insulating film 713 and the insulating film 718. In this embodiment, since the insulating film 713 is formed to have a thickness of 1500 nm and the insulating film 718 is formed to have a thickness of 2000 nm, the end of the insulating film 718, which covers the end portion of the insulating film 713, is away from the end of the insulating film 713 by a distance d of 7000 nm. With such a structure, a margin for a process can be ensured, and further, entry of moisture and oxygen can be prevented.

Next, an antenna 720 is formed over the insulating film 718 (see FIG. 9A). Then, the antenna 720 and the conductive film 717 are connected to each other through an opening. The opening is provided below the antenna 720 to improve the degree of integration. Note that although the antenna 720 may be directly connected to the conductive films 731a, provision of the conductive film 717 as in this embodiment is preferable because a margin can be secured for formation of the opening for connection with the antenna 720, and high integration can be achieved. Therefore, a conductive film may be further provided over the conductive film 717 to be connected to the antenna 720. That is, the antenna 720 may be electrically connected to the conductive films 731a included in the thin film transistors, and high integration can be achieved with a connection structure through a plurality of conductive films. When the thicknesses of the plurality of conductive films such as the conductive film 717 are large, the semiconductor device also has a large thickness; therefore, the thicknesses of the plurality of conductive films are preferably small. Therefore, the thickness of the conductive film 717 or the like is preferably smaller than that of the conductive film 731a.

The antenna 720 can employ a layered structure of a first conductive film 721 and a second conductive film 722. In this embodiment, the case where a layered structure is formed by employing a 100 nm titanium film and a 5000 nm aluminum film as the first conductive film 721 and the second conductive film 722, respectively, is described as an example. Titanium can increase moisture resistance of the antenna, and can increase adhesion between the insulating film 718 and the antenna 720. In addition, titanium can reduce contact resistance against the conductive film 717. This is because the titanium film formed as the uppermost layer of the conductive film 717, and the titanium film of the antenna 720, which are in contact with each other, are both formed from titanium. Such a titanium film is formed by dry etching, so an end portion thereof tends to have a steep angle. Aluminum is a low resistance material, so it is suitable for the antenna. By forming the aluminum film thickly, resistance can be further lowered. Resistance of the antenna is preferably lowered because a communication distance can be increased. Such an aluminum film is formed by wet etching, so a side surface of the end portion tends to have a tapered shape. The tapered shape in this embodiment is a shape the side surface of which curves toward the inside of the aluminum film, that is, a shape having a curved recessed side surface. Further, when the aluminum film is wet etched, the end of the aluminum film is on an inner side than the end of the titanium film (a region 742). For example, it is preferable that the end of the aluminum film be on an inner side than the end of the titanium film so that the distance between the ends of the aluminum film and the titanium film (a distance L) is one-sixth to one-half the thickness of the aluminum film. In this embodiment, the end of the aluminum film may be on an inner side than the end of the titanium film so that the distance therebetween may be the distance L of from 0.8 µm to 2 µm. Since the end portion of the titanium film projects from the end portion of the aluminum film, breakage of an insulating film which is formed later can be prevented, and further, the durability of the antenna can be increased.

The antenna may be formed using, as a conductive material, a material containing a metal element such as silver, copper, gold, platinum, nickel, palladium, tantalum, or molybdenum; an alloy material containing any of the metal elements; or a compound material containing any of the metal elements, instead of aluminum and titanium, by a CVD method, a sputtering method, a printing method such as screen printing or gravure printing, a droplet discharge method, a dispenser method, a plating method, or the like. Although a layered structure is described as an example in this embodiment, a single-layer structure of any of the above materials may be employed.

An insulating film 723 is formed so as to cover the antenna 720. In this embodiment, the insulating film 723 is formed using a silicon nitride film having a thickness of 200 nm. The insulating film 723 is preferably provided because moisture resistance of the antenna can be further increased. Since the end of the titanium film projects from the end of the aluminum film, the insulating film 723 can be formed without breakage. The insulating film 723 described above may be formed using a silicon oxynitride film, a silicon nitride oxide film, or another inorganic material instead of the silicon nitride film.

Further, as illustrated in FIG. 12, the insulating film 723 and the insulating film 712 are preferably in contact with each other outside the insulating film 718, that is, outside the antenna in the circuit portion (specifically, a region 741). In this embodiment, both of the insulating films 712 and 723 are silicon nitride films. Since the parts formed from the same material are closely attached to each other, the adhesion is high and entry of moisture and oxygen can be efficiently prevented. Further, a silicon nitride film is denser than a silicon oxide film and thus can effectively prevent entry of moisture and oxygen. The region in which the insulating films 712 and 723 are closely attached to each other is in the peripheral region, which is not provided with the antenna or the thin film transistor, and therefore, has a very small thickness of from 3 µm to 4 µm. The peripheral region is formed to surround the circuit portion. As compared to the case of a semiconductor device which does not employ such a structure of a peripheral region, in the case of the semiconductor device of this embodiment, defects caused by a change over time in shape and characteristics, such as peeling at the end portion of the semiconductor device, can be reduced.

Then, a first insulator 751 is formed so as to cover the insulating film 723 (see FIG. 9B). In this embodiment, a structure body 726 in which a fibrous body 727 is impregnated with an organic resin 728 is used as the first insulator 751. Further, the case where a first impact attenuating layer 750 is provided on a surface of the structure body 726 is described as a preferred example. In this embodiment, an aramid resin is used for the first impact attenuating layer 750.

The structure body 726 in which the fibrous body 727 is impregnated with the organic resin 728 is also referred to as a prepreg. A prepreg is formed specifically in such a manner that a fibrous body is impregnated with varnish in which a matrix resin is diluted with an organic solvent, and then the organic solvent is volatilized and the matrix resin is semi-cured. A prepreg has a modulus of elasticity of from 13 GPa to 15 GPa, and a modulus of rupture of 140 MPa. By using the prepreg which is formed into a thin film, a thin semiconductor device capable of being curved can be manufactured. As typical examples of a fibrous body for a prepreg, a polyvinyl alcohol fiber, a polyester fiber, a polyamide fiber, a polyethylene fiber, an aramid fiber, a polyparaphenylene benzobisoxazole fiber, a glass fiber, and carbon fiber are given. As typical examples of a resin which is used for forming a matrix resin, an epoxy resin, an unsaturated polyester resin, a polyimide resin, and a fluorine resin are given. Note that the prepreg is described in detail in an embodiment below.

In addition to the structure body 726, the first insulator 751 can include a layer containing a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may be used for the first insulator 751. Further, the first impact attenuating layer 750 is acceptable as long as it is formed from a high-strength material. Examples of the high-strength material include a polyvinyl alcohol resin, a polyester resin, a polyamide resin, a polyethylene resin, a polyparaphenylene benzobisoxazole resin, and a glass resin, as well as an aramid resin.

The thickness of the first insulator 751 is from 5 μm to 100 μm, preferably from 10 μm to 50 μm. In this embodiment, the thickness of the first insulator 751 is 32 μm. In the first insulator 751 in this embodiment, the thickness of the structure body 726 and the thickness of the first impact attenuating layer 750 are 20 μm and 12 μm, respectively. With such a structure, a thin semiconductor device capable of being curved can be manufactured.

After the first impact attenuating layer 750 is formed, a first conductive layer 729 is formed on a surface of the first impact attenuating layer 750. The case where a 100 nm-thick film of a compound of silicon oxide and indium tin oxide is used as the first conductive layer 729 is described as an example. The above first conductive layer 729 is acceptable as long as it has lower resistance than the structure body 726 and the first impact attenuating layer 750. Therefore, the first conductive layer 729 may be a film or a group of islands arranged with small gaps therebetween. In addition, since the resistance of the first conductive layer 729 is preferably low, the thickness thereof can be from 50 nm to 200 nm, in consideration of specific resistance or the like of the material which is used. If the first conductive layer 729 is made thick, the resistance can be lowered, which is preferable. The first conductive layer 729 may be formed using, instead of a compound of silicon oxide and indium tin oxide, a material containing an element selected from titanium, molybdenum, tungsten, aluminum, copper, silver, gold, nickel, tin, platinum, palladium, iridium, rhodium, tantalum, cadmium, zinc, iron, silicon, germanium, zirconium, and barium; an alloy material containing any of the above elements as its main component; a compound material containing any of the above elements as its main component; or the like. The first conductive layer 729 can be formed by a sputtering method, a plasma CVD method, a coating method, a printing method, or the like. Alternatively, a plating method such as an electrolytic plating method or an electroless plating method may be used. Note that an insulating film may be formed on the surface of the first conductive layer 729 so that the first conductive layer 729 can be protected.

Figure 10:
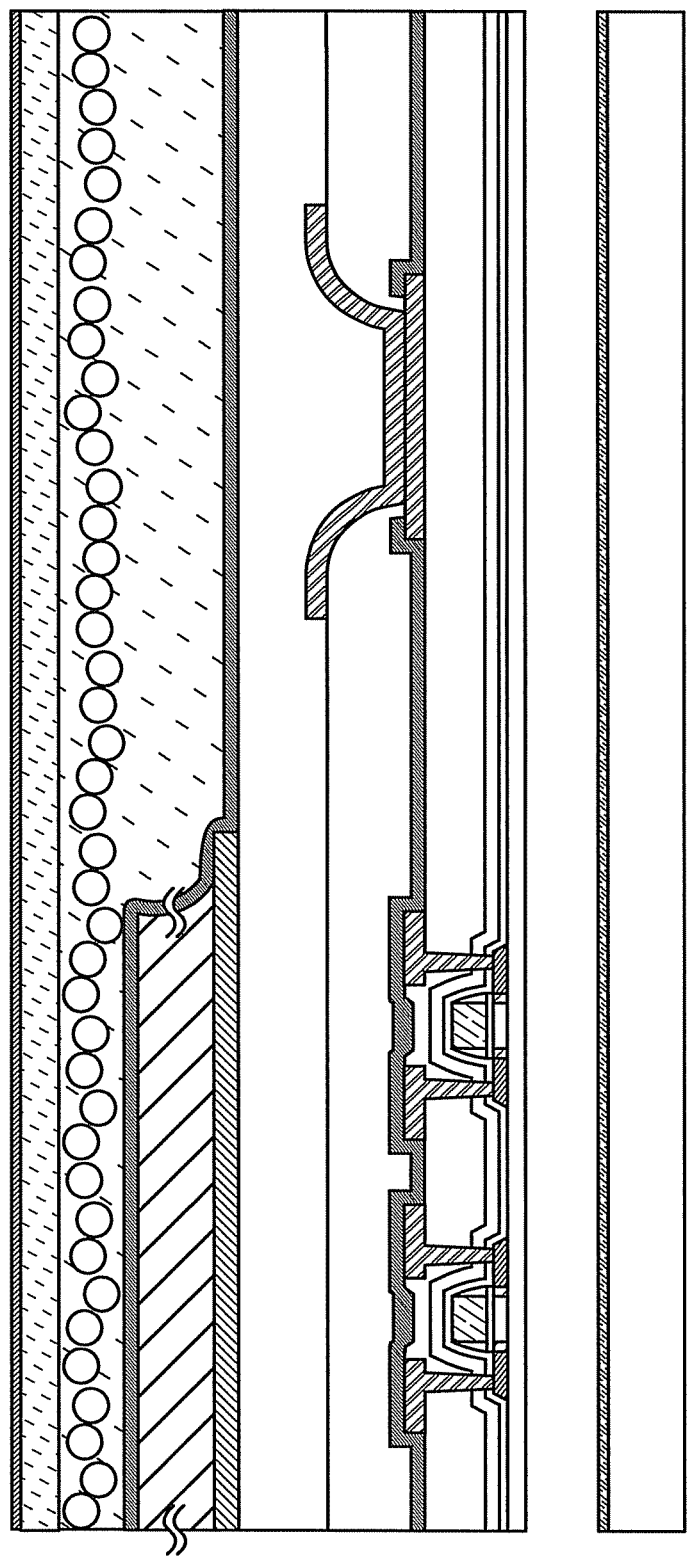
FIG. 10 illustrates one mode of Embodiment 2.

Next, a layer including the element layer including the thin film transistors 730a and 730b, the conductive film serving as the antenna 720, and the like is separated from the substrate 701 (see FIG. 10). In this step, the separation occurs at the interface between the separation layer 702 and the substrate 701, the interface between the separation layer 702 and the insulating film 703, or in the separation layer 702, whereby the layer including the element layer including the thin film transistors 730a and 730b, the conductive film serving as the antenna 720, and the like is separated. If the separation layer 702 unnecessarily remains on the separated layer, the separation layer 702 may be removed by etching or the like. As a result, adhesion between the insulating film 703 and a layer to be formed later can be increased.

Note that by performing the separation while wetting a separation surface with water or a solution such as ozone water, so that the elements such as the thin film transistors 730a and 730b can be prevented from being broken due to static electricity and the like. This is because an electric charge is neutralized in such a manner that unpaired electrons in the separation layer 702 are paired with ions in the solution.

In addition, cost can be reduced by reusing the substrate 701 after the separation.

Figure 11:
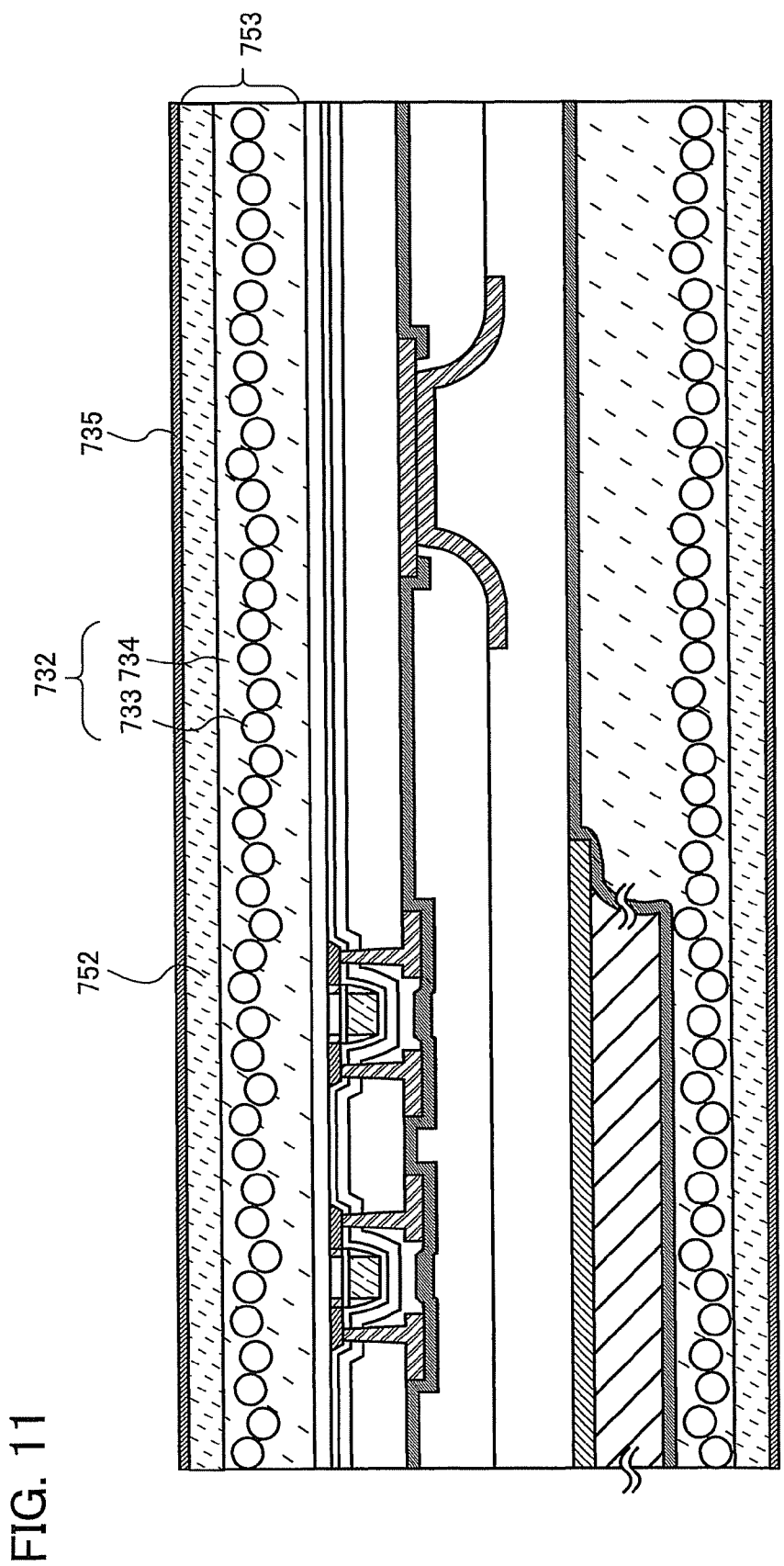
FIG. 11 illustrates one mode of Embodiment 2.

Next, a second insulator 753 is formed so as to cover the surface exposed by the separation (see FIG. 11). The second insulator 753 can be formed similarly to the first insulator 751. In this embodiment, the case is described in which, as the second insulator 753, a structure body 732 using a so-called prepreg, in which a fibrous body 733 is impregnated with an organic resin 734 is provided and further a second impact attenuating layer 752 is provided on a surface of the structure body 732. An aramid resin is used for the second impact attenuating layer 752. It is needless to say that only the structure bodies 726 and 732 can be provided for attachment. In this case, the thickness of the semiconductor device is 40 μm to 70 μm, preferably, 40 μm to 50 μm. The thickness of the semiconductor device provided with the first and second impact attenuating layers is 70 μm to 90 μm, preferably, 70 μm to 80 μm.

Next, a second conductive layer 735 is formed on a surface of the second insulator 753. The second conductive layer 735 can be formed similarly to the first conductive layer 729. Note that an insulating film may be formed on a surface of the second conductive layer 735 so that the second conductive layer 735 can be protected. Through the above steps, a layered body can be obtained in which the element layer and the antenna are sealed between the first insulator 751 and the second insulator 753, the first conductive layer 729 is formed on a surface of the first insulator 751, and the second conductive layer 735 is formed on the surface of the second insulator 753.

Then, the layered body is cut with a cutting means into separate semiconductor devices. As the cutting means, it is preferable to use a unit which melts the first insulator 751 and the second insulator 753 in the cut (it is more preferable to use a unit which melts the first conductive layer 729 and the second conductive layer 735). In this embodiment, laser beam irradiation is used for the cut.

There is no particular limitation on the conditions, such as wavelength, intensity, and beam size of the laser beam used for the above cut. The laser beam irradiation may be performed under such conditions that the division can be performed. As a laser, it is possible to use, for example, a continuous-wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

As described in this embodiment, by cutting the semiconductor device into separate semiconductor devices by laser beam irradiation, the resistance between the first conductive layer 729 and the second conductive layer 735 is decreased, whereby conduction between the first conductive layer 729 and the second conductive layer 735 is achieved. Accordingly, the step of cutting the semiconductor device and the step of achieving conduction between the first conductive layer 729 and the second conductive layer 735 can be performed at a time.

The value of resistance between the first conductive layer 729 and the second conductive layer 735 should be lower than that of the first insulator 751 and that of the second insulator 753. The value of resistance between the first conductive layer 729 and the second conductive layer 735 may be, for example, 1 GΩ or less, preferably from about 5 MΩ to about 500 MΩ, and more preferably from about 10 MΩ to about 200 MΩ. Therefore, the semiconductor device may be cut with laser beam irradiation or the like so that the above value of resistance can be obtained.

Thus, semiconductor devices which are formed by using an insulating substrate can be completed.

This embodiment can be combined with any of the other embodiments as appropriate.

(Embodiment 3)

In this embodiment, an example of a cutting step of a semiconductor device is described. Note that the cutting step is described with reference to FIG. 13 and FIG. 14 which illustrate a portion between the semiconductor devices, that is, a peripheral portion.

Figure 13:
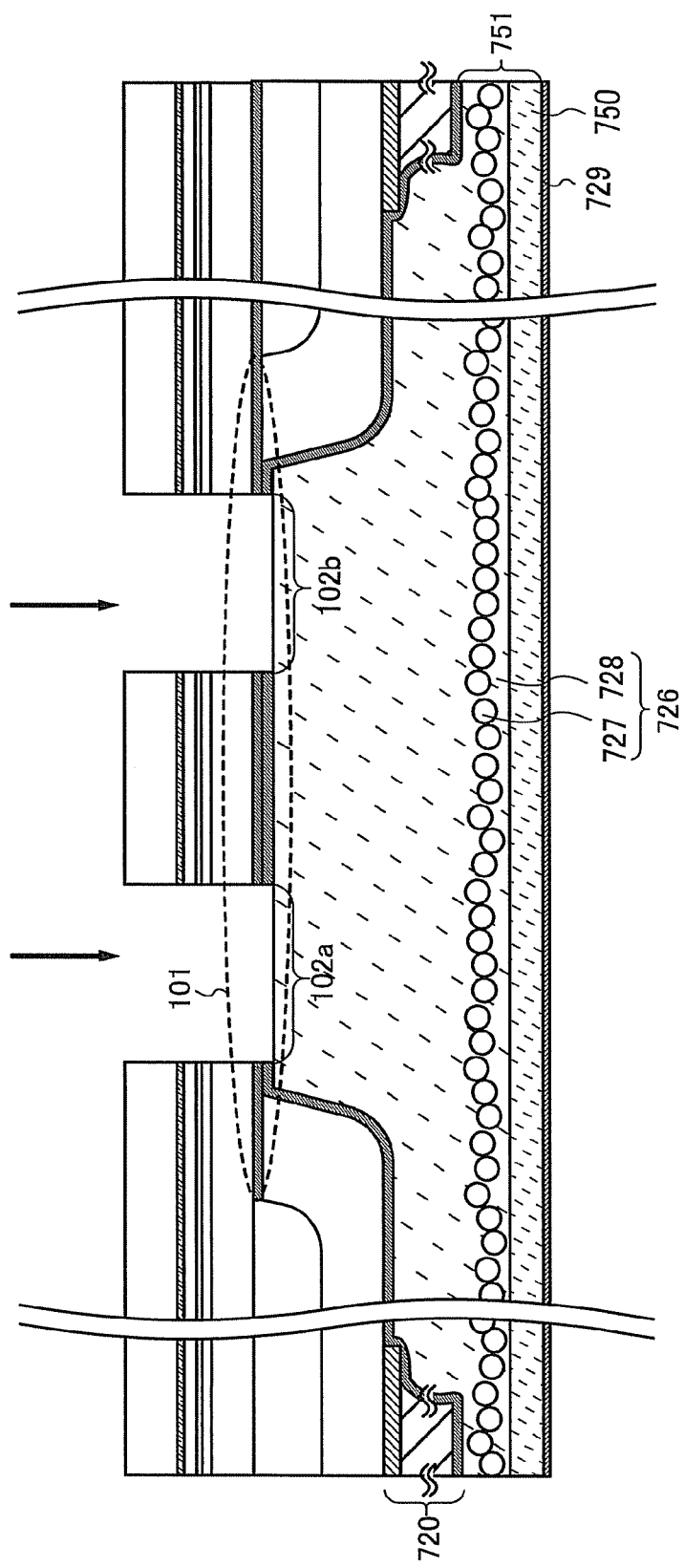
FIG. 13 illustrates one mode of Embodiment 3.

First, the steps up to the formation of the first conductive layer 729 are performed as described in the above embodiments. After that, as illustrated in FIG. 13, attachment regions 102a and 102b are formed selectively in the peripheral region 101, that is, in parts of the peripheral region 101, with a removing means. In selectively removing the peripheral region 101, in the depth direction, the separation layer, the insulating film, and the like are removed to expose the structure body 726. Besides, the attachment regions 102a and 102b are provided to each surround the circuit portion 100 when the semiconductor device is seen from above.

A laser beam can be used for such a removing means. That is, the principles of laser ablation can be utilized. There is no particular limitation on conditions, such as wavelength, intensity, and a beam size of the laser beam used for the removing means. The laser beam irradiation may be performed under such conditions that at least the separation layer, the insulating film, and the like can be removed. As a laser, it is possible to use, for example, a continuous-wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

Note that after the semiconductor device is cut into separate semiconductor devices, the attachment regions 102a and 102b are separately included in the neighboring semiconductor devices. In a similar manner, the peripheral region 101 becomes peripheral regions 101a and 101b which are separately included in the neighboring semiconductor devices after the semiconductor device is cut into separate semiconductor devices (see FIG. 14).

Figure 14:
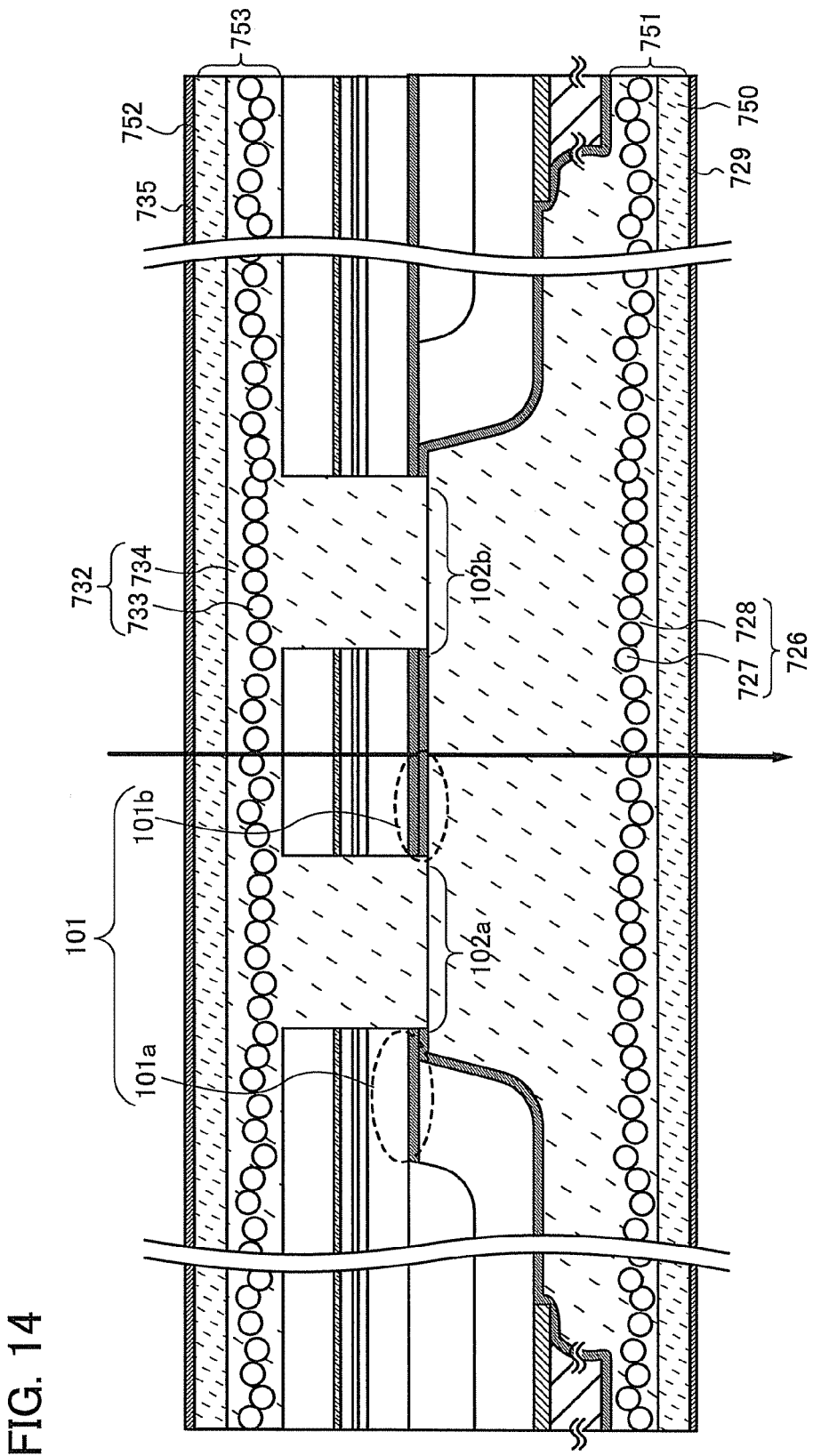
FIG. 14 illustrates one mode of Embodiment 3.
Figure 15A:
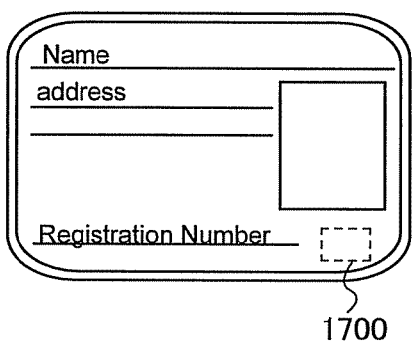
FIGS. 15A to 15F each illustrate one mode of Embodiment 4.
Figure 15B:
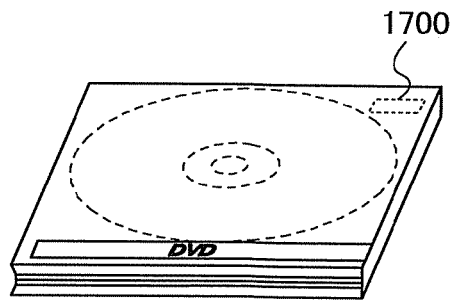
Figure 15C:
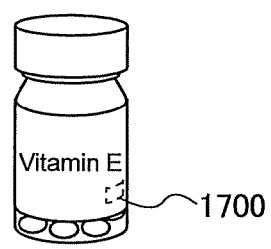
Figure 15D:
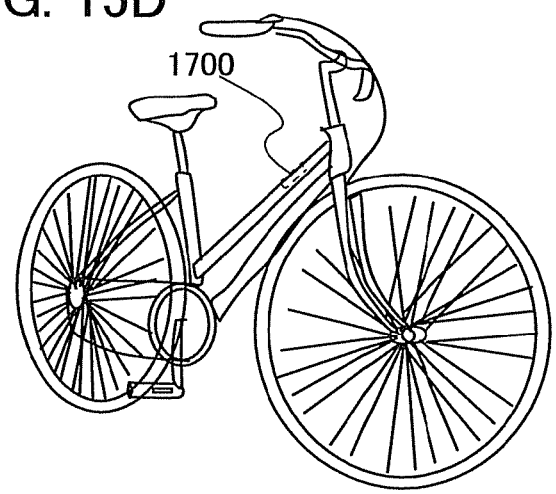
Figure 15E:
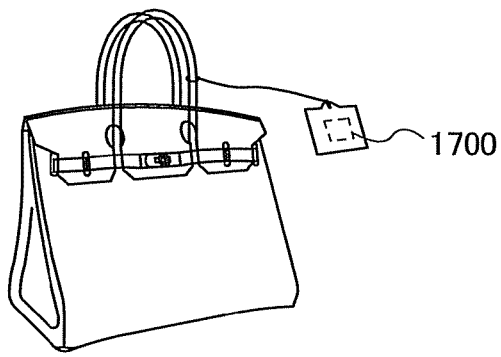
Figure 15F:
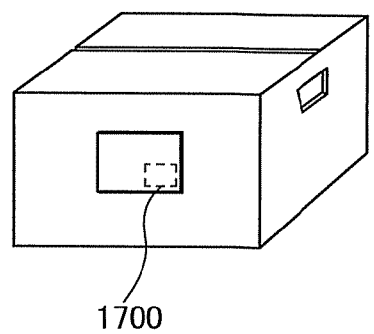

Then, as illustrated in FIG. 14, the second insulator 753 and the second conductive layer 735 are formed. In the attachment regions 102a and 102b, the structure bodies 726 and 732 are directly attached. In specific, the organic resin 728 of the structure body 726 and the organic resin 734 of the structure body 732 are in contact and are closely attached to each other. The parts formed from the same materials are closely in contact with each other in such a manner, whereby attachment strength is increased, which is preferable.

After the attachment is completed, the semiconductor device is cut into separate semiconductor devices. The above embodiments can be referred to for the details of the cutting means.

Thus, semiconductor devices with higher attachment strength and higher reliability which are formed using an insulating substrate can be completed.

This embodiment can be combined with any of the other embodiments as appropriate.

(Embodiment 4)

In this embodiment, application examples of the semiconductor device according to Embodiments 1 and 2 of the present invention are described.

As illustrated in FIGS. 15A to 15F, the semiconductor device is widely used by being provided in, for example, bills, coins, securities, bearer bonds, documents (such as driver's licenses or resident's cards, see FIG. 15A), packaging containers (such as wrapping paper or bottles, see FIG. 15C), storage media (such as DVD software or video tapes, see FIG. 15B), vehicles (such as bicycles, see FIG. 15D), personal belongings (such as bags or pairs of glasses), foods, plants, animals, human bodies, clothing, everyday articles, products such as electronic appliances (liquid crystal display devices, EL display devices, television sets, or mobile phones), or tags on products (see FIGS. 15E and 15F), or the like.

A semiconductor device 1700 is fixed to products by, for example, being mounted on a printed board, being attached to a surface thereof, or being embedded therein. For example, the semiconductor device 1700 can be embedded in paper of a book, or embedded in an organic resin of a package. Since the semiconductor device 1700 can be reduced in size, thickness, and weight, it can be fixed to products without spoiling the design thereof. Further, bills, coins, securities, bearer bonds, documents, or the like can have identification functions by being provided with the semiconductor device 1700, and the identification functions can be utilized to prevent counterfeits. Further, the efficiency of a system such as an inspection system can be improved by providing the semiconductor device 1700 in, for example, packaging containers, storage media, personal belongings, foods, clothing, everyday articles, or electronic appliances. Even vehicles can have higher security against theft or the like by being each provided with the semiconductor device 1700.

By thus using the semiconductor device according to an embodiment of the present invention for purposes given in this embodiment, data used for data communication can be kept accurate; therefore, authentication, security, or the like of a product can be improved.

Note that this embodiment can be combined with any of the other embodiments as appropriate.

The present invention disclosed herein is not limited to the above description because it will be easily understood by those skilled in the art that various changes and modifications can be made to the modes and their details without departing from the spirit and scope of the present invention disclosed herein. Therefore, the present invention disclosed herein should not be construed as being limited to the description in the above embodiments.

This application is based on Japanese Patent Application serial no. 2008-329711 filed with Japan Patent Office on Dec. 25, 2008, the entire contents of which are hereby incorporated by reference.

Explanation Of Reference

100: circuit portion, 101: peripheral region, 101a: peripheral region, 102a: region, 200: signal, 201: signal, 300:

antenna, 301: rectifier circuit, 302: demodulation circuit, 303: oscillation circuit, 304: synchronization circuit, 305: decoder circuit, 306: register, 307: constant voltage circuit, 400: AC signal, 402: encoded signal, 403: clock signal, 404: encoded signal, 405: received data signal, 500: signal, 701: substrate, 702: separation layer, 703: insulating film, 704: semiconductor film, 704a: semiconductor film, 704b: semiconductor film, 705: gate insulating film, 706a: channel formation region, 706b: impurity region, 706c: impurity region, 707: gate electrode, 708: insulating film, 709: insulating film, 710: insulating film, 711: insulating film, 712: insulating film, 713: insulating film, 714: opening, 715: region, 717: conductive film, 718: insulating film, 720: antenna, 721: conductive film, 722: conductive film, 723: insulating film, 726: structure body, 727: fibrous body, 728: organic resin, 729: conductive layer, 730a: thin film transistor, 730b: thin film transistor, 731a: conductive film, 731b: conductive film, 732: structure body, 733: fibrous body, 734: organic resin, 735: conductive layer, 740: region, 741: region, 742: region, 749: element layer, 750: impact attenuating layer, 751: insulator impact attenuating layer, and 753: insulator.

The invention claimed is:

1. A semiconductor device comprising:
    an antenna configured to receive carrier waves and convert the carrier waves into an AC signal;
    a rectifier circuit configured to rectify the AC signal into a DC voltage;
    a demodulation circuit configured to demodulate the AC signal into an encoded signal;
    an oscillator circuit configured to generate a first clock signal by supply of the DC voltage;
    a synchronizing circuit configured to generate a synchronized encoded signal by synchronizing the encoded signal with use of the first clock signal;
    a decoder circuit configured to decode the synchronized encoded signal into a digital signal; and
    a register configured to store the digital signal with use of the synchronized encoded signal delayed from the first clock signal as a second clock signal.

2. The semiconductor device according to claim 1, further comprising a constant voltage circuit configured to supply a constant DC voltage to the oscillator circuit.

3. The semiconductor device according to claim 1, wherein a frequency of the second clock signal is lower than a frequency of the first clock signal.

4. The semiconductor device according to claim 1, wherein the semiconductor device is configured to receive power without contact.

5. The semiconductor device according to claim 1, wherein the synchronized encoded signal is supplied to the decoder circuit and the register.

6. The semiconductor device according to claim 1, wherein the digital signal is a stabilized voltage.

7. The semiconductor device according to claim 1,
    wherein a frequency of the first clock signal is lower than a frequency of the carrier waves, and
    wherein the frequency of the first clock signal has a certain oscillation frequency.

8. The semiconductor device according to claim 1, wherein the second clock signal is delayed by two cycles of the first clock signal.

9. An electronic appliance using the semiconductor device according to claim 1.

10. A semiconductor device comprising:
    an antenna configured to receive carrier waves and convert the carrier waves into an AC signal;
    a rectifier circuit configured to rectify the AC signal into a DC voltage;
    a demodulation circuit configured to demodulate the AC signal into an encoded signal;
    a decoder circuit configured to decode the encoded signal into a decoded signal;
    a first unit configured to generate a first clock signal by supply of the DC voltage;
    a second unit configured to generate a synchronized encoded signal by synchronizing the encoded signal with use of the first clock signal; and
    a third unit configured to store data obtained by decoding the synchronized encoded signal in the decoder circuit, with the synchronized encoded signal delayed from the first clock signal utilized as a second clock signal.

11. The semiconductor device according to claim 10, further comprising a constant voltage circuit configured to supply a constant DC voltage to the first unit.

12. The semiconductor device according to claim 10, wherein a frequency of the second clock signal is lower than a frequency of the first clock signal.

13. The semiconductor device according to claim 10, wherein the semiconductor device is configured to receive power without contact.

14. The semiconductor device according to claim 10, wherein the synchronized encoded signal is supplied to the decoder circuit and the third unit.

15. The semiconductor device according to claim 10, wherein the data is a stabilized voltage.

16. The semiconductor device according to claim 10,
    wherein a frequency of the first clock signal is lower than a frequency of the carrier waves, and
    wherein the frequency of the first clock signal has a certain oscillation frequency.

17. The semiconductor device according to claim 10, wherein the second clock signal is delayed by two cycles of the first clock signal.

18. An electronic appliance using the semiconductor device according to claim 10.

19. A driving method for a semiconductor device including an antenna, a rectifier circuit, a demodulation circuit, an oscillator circuit, a synchronized circuit, a decoder circuit, and a register, comprising the steps of:
    receiving carrier waves;
    converting the carrier waves into an AC signal by the antenna;
    rectifying the AC signal into a DC voltage;
    demodulating the AC signal into an encoded signal;
    generating a first clock signal in the oscillator circuit supplied with the DC voltage;
    generating a synchronized encoded signal by synchronizing the encoded signal with use of the first clock signal;
    supplying the synchronized encoded signal to the decoder circuit and the register;
    decoding the synchronized encoded signal into a digital signal; and
    storing the digital signal to the register with use of the synchronized encoded signal delayed from the first clock signal as a second clock signal.

20. The driving method of a semiconductor device, according to claim 19,
    wherein the semiconductor device further comprises a constant voltage circuit, and
    wherein the driving method further comprises the step of supplying a constant DC voltage to the oscillator circuit.

21. The driving method of a semiconductor device, according to claim 19, wherein a frequency of the second clock signal is lower than a frequency of the first clock signal.

22. The driving method of a semiconductor device, according to claim 19, wherein the semiconductor device is configured to receive power without contact.

23. The driving method of a semiconductor device, according to claim 19, wherein the synchronized encoded signal is supplied to the decoder circuit and the register.

24. The driving method of a semiconductor device, according to claim 19, wherein the digital signal is a stabilized voltage.

25. The driving method of a semiconductor device, according to claim 19,
   wherein a frequency of the first clock signal is lower than a frequency of the carrier waves, and
   wherein the frequency of the first clock signal has a certain oscillation frequency.

26. The driving method of a semiconductor device, according to claim 19, wherein the second clock signal is delayed by two cycles of the first clock signal.

* * * * *